United States Patent [19]

Wells et al.

[11] Patent Number: 5,341,330

[45] Date of Patent: Aug. 23, 1994

[54] METHOD FOR WRITING TO A FLASH MEMORY ARRAY DURING ERASE SUSPEND INTERVALS

[75] Inventors: Steven E. Wells, Citrus Heights; Mark Winston; Virgil N. Kynett, both of Eldorado Hills, all of Calif.

[73] Assignee: Intel Corporation, Santa Clara, Calif.

[21] Appl. No.: 145,732

[22] Filed: Nov. 1, 1993

Related U.S. Application Data

[63] Continuation of Ser. No. 969,463, Oct. 30, 1992, abandoned.

[51] Int. Cl.$^5$ ............................................. G11C 13/00
[52] U.S. Cl. .................................... 365/185; 365/900
[58] Field of Search ........... 365/900, 149, 185, 189.01, 365/230.01

[56] References Cited

U.S. PATENT DOCUMENTS

| | | |
|---|---|---|
| 4,642,759 | 2/1987 | Foster . |
| 4,644,494 | 2/1987 | Muller . |
| 4,763,305 | 8/1988 | Kuo . |
| 4,802,117 | 1/1989 | Chrosny et al. . |
| 4,896,262 | 1/1990 | Wayama et al. . |
| 4,958,315 | 9/1990 | Balch . |
| 5,012,425 | 4/1991 | Brown . |
| 5,070,474 | 12/1991 | Tuma et al. . |
| 5,101,490 | 3/1992 | Getson, Jr. et al. . |
| 5,111,385 | 5/1992 | Hattori . |
| 5,131,089 | 7/1992 | Cole . |
| 5,199,033 | 3/1993 | McGeoch et al. . |
| 5,200,959 | 4/1993 | Gross et al. . |
| 5,224,070 | 6/1993 | Fandrich et al. ................... 365/900 |

FOREIGN PATENT DOCUMENTS

| | | | |
|---|---|---|---|
| 2088442 | 1/1993 | Canada ................................... 13/16 |
| 017548A2 | 3/1986 | European Pat. Off. . | |
| 0392895 | 10/1990 | European Pat. Off. ................... 16/6 |
| 251324 | 1/1992 | United Kingdom ..................... 12/2 |
| 2251323 | 1/1992 | United Kingdom ..................... 12/2 |

OTHER PUBLICATIONS

Solid-State Mass Storage Arrives, Product Feature, Memory Card Systems & Design, Jul./Aug. 1992.

Optimal Solid State Disk Architecture for Portable Computers, Dan Auclair pp. 811-815, Proceedings of Silicon Valley P.C. Design Conference, Jul. 9, 1991.

Primary Examiner—Terrell W. Fears
Attorney, Agent, or Firm—Blakely, Sokoloff, Taylor & Zafman

[57] ABSTRACT

A method for writing data to an entry in a portion of a flash EEPROM memory array during a period in which that portion of the array is being erased and writing is prohibited. The method includes writing the data to a new entry position apart from the portion of the array which is being erased along with a revision number which is greater than the revision number of the original data in the original portion of the array, writing of the busy condition of the original entry to a temporary storage position apart from the portion of the array which is being erased, and invalidating entries listed in the temporary storage position when the erase operation is concluded.

6 Claims, 3 Drawing Sheets

METHOD FOR WRITING TO A FLASH MEMORY ARRAY DURING ERASE SUSPEND INTERVALS

This is a continuation of application Ser. No. 07/969,463, filed Oct. 30, 1992, abandoned.

BACKGROUND OF THE INVENTION

1. Field of the Invention

This invention relates to flash electrically-erasable programmable read-only memories (flash EEPROM) and, more particularly, to methods for writing to such memories during intervals in which writing is prohibited in order to indicate the invalidity of data stored in such memories.

2. History of the Prior Art

Modern computer systems make extensive use of long term memory. Typically this memory is provided by one or more electro-mechanical hard (fixed) disk drives constructed of flat circular magnetic disks which rotate about a central axis and which have a mechanical arm to write to or to read from positions on the magnetic disk. Hard disk drives are very useful and have become almost a necessity to the operation of personal computers. However, such electro-mechanical drives are relatively heavy, require a significant amount of space within a computer, require a significant amount of the power in use, and are very susceptible to shock. A hard drive within a portable computer which is dropped is quite likely to cease functioning with a catastrophic loss of data.

Recently, forms of long term storage other than electro-mechanical hard disk drives have become feasible for use in computers. One of these is flash EEPROM. A flash EEPROM memory array includes a large plurality of floating-gate field effect transistors arranged as memory cells in typical row and column fashion with circuitry for accessing the individual cells and placing the memory transistors of those cells in one of two memory conditions. A flash memory cell, like a typical EPROM cell retains information when power is removed.

Flash EEPROM memory has a number of characteristics which adapt it to use as long term memory. It is light in weight, occupies very little space, and consumes less power than electro-mechanical disk drives. More importantly, it is especially rugged. It will withstand without adverse effects repeated drops each of which would destroy a typical electro-mechanical hard disk drive.

A difficulty with flash EEPROM, however, is that it is very slow to erase. Flash EEPROM is erased by applying a high voltage simultaneously to the source terminals of all of the transistors (cells) used in the memory. Because these source terminals are all connected to one another by metallic busing in the array, the entire array must be erased at once. While an electro-mechanical hard disk will typically store information in a first area of the disk and then rewrite that same area of the disk when the information changes, this is not possible with a flash memory array without erasing all of the valid information that remains in the array along with the invalid (dirty) information.

Because of this, a different arrangement is used for erasing dirty sectors of a flash EEPROM array. Such an arrangement is disclosed in detail in U.S. patent application Ser. No. 969,463, entitled *Method and Circuitry for A Solid State Memory Disk*, S. Wells, filed on even date herewith, and assigned to the assignee of the present invention. First, the entire array is divided into smaller separately erasable blocks so that when a block is erased the amount of valid data which must be reprogrammed is reduced. Typically, the array is composed of a number of silicon chips; and each such chip includes a number of such blocks. Then, when the information at a data entry changes, the changed information is written to a new sector on an available block rather than written over the old data; and the old data is marked dirty. When erasure occurs, all of the valid data in the block to be erased is written to a new block; and then the dirty block is erased and put back into use as a clean block of memory. Because of this involved erasure process, it typically takes as much as two seconds to erase a flash EEPROM array. However, because erasure need not occur with each entry which is rewritten, erasure may be delayed until a block contains a sufficient amount of dirty information that cleanup is feasible. This reduces the number of erasure operations to a minimum and allows erasure to occur in the background when the facilities for controlling the array are not otherwise occupied with reading and writing.

Because erasure takes so long, provision is made for suspending the erasure so that data may be read from a block in a silicon chip being erased. Write operations to the blocks of a chip of the array being erased are not allowed, however, because the circuitry which accomplishes the write operation is occupied with the erase process.

It is however, possible to write changed data to blocks on chips other than the chip containing the block being erased. The arrangement for writing simply finds unused space in the array and writes to that space. This is possible because the addressing scheme used treats the address as a logical address and records that logical address along with the physical address in a lookup table in random access memory associated with the control circuitry. The writing of data requires, however, that when updated data is rewritten to a new physical address, the lookup table entry be updated and the old entry in flash memory be marked as invalid (dirty). The old entry must be so marked because the RAM lookup table is destroyed when power is removed, and the entries in the flash EEPROM memory are reviewed to provide the data to reconstruct the lookup table each time power is applied. Normally, this causes no problem. However, if data being changed is stored in a block on a chip which is presently being erased, then the data cannot be marked as invalid during the erase process (even during a suspend) as this requires a write operation to a chip being erased. Consequently, the marking cannot be accomplished until the erase process has been completed.

If power is removed during this period, two entries will exist on power up without a method of distinguishing which is valid and which is invalid.

SUMMARY OF THE INVENTION

It is, therefore, an object of the present invention to provide an arrangement for accurately discerning between valid and invalid data in a computer memory.

It is another object of the present invention to provide apparatus for accurately distinguishing invalid portions of semiconductor memory arrays.

These and other objects of the present invention are realized in a method for writing data to an entry in a portion of a flash EEPROM memory array during a period in which that portion of the array is being erased and writing is prohibited. The method includes writing the data to a new entry position apart from the portion of the array which is being erased along with a revision number for the new entry which is greater than a revision number of the entry holding in the original data in the portion of the array being erased, writing an indication of the busy condition of the original entry to a temporary storage position apart from the portion of the array which is being erased, invalidating entries listed in the temporary storage position when the erase operation is concluded, and testing for the latest revision of duplicate entries when power is applied to the array.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer and the method of computation itself should be borne in mind. The present invention relates to a method for operating a computer in processing electrical or other (e.g. mechanical, chemical) physical signals to generate other desired physical signals.

DETAILED DESCRIPTION

Figure 1:
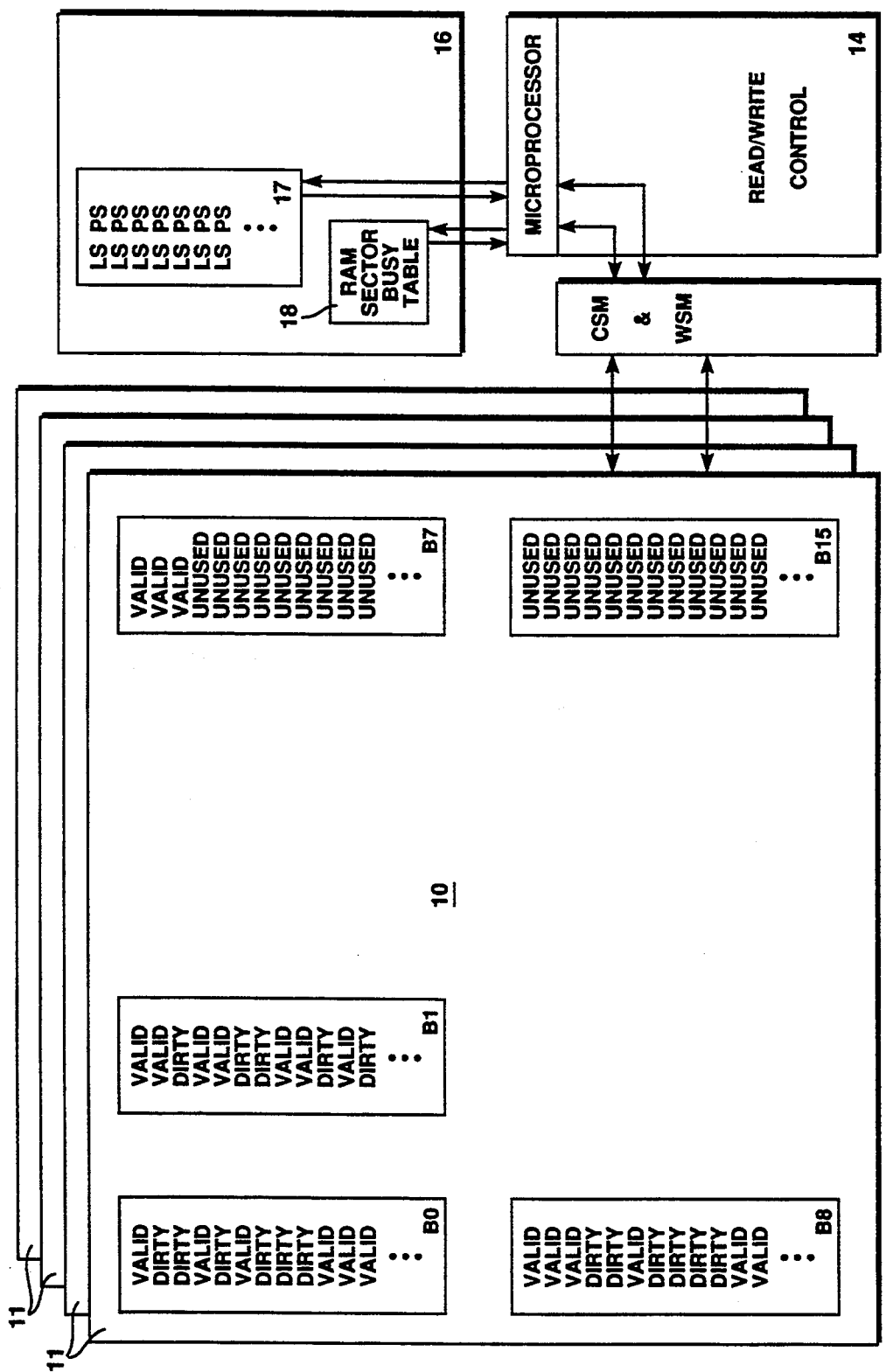
FIG. 1 is a block diagram illustrating a flash EEPROM memory array in which the present invention may be used.

Referring now to FIG. 1, there is illustrated in block diagram form a flash EEPROM memory array 10 in which the present invention may be practiced. The array 10 includes a plurality of blocks B0–B15 of flash EEPROM memory. Each block includes floating-gate field effect transistor memory devices or cells (not shown) arranged in typical row and column fashion and having circuitry arranged for selecting any particular block of memory and any particular row and column so that the memory device at that position may be written or read. The details of the layout of transistor memory arrays and the associated accessing circuitry are well known to those skilled in the art and are, therefore, not shown here.

Flash EEPROM memory is essentially an EPROM array with facilities provided so that when divided into blocks in the manner illustrated an entire block may be erased by a high voltage value applied simultaneously to the source terminals of all the memory transistors of the block. Such an erasure places each of the cells in the one condition. When in that condition, a zero or a one may be written to a cell. A one leaves the cell in the same one condition while a zero switches the cell to the zero condition. A cell cannot be switched back from the zero condition to the one condition without the application at its source terminal of the high value of voltage required for erasure. Since this voltage value is not a typical operating value and since all source terminals of the memory transistors of a block are joined together, a cell in a zero state remains in that state until the entire block of the array is erased once again.

In the array 10 illustrated in FIG. 1, blocks B0–B15 of memory are shown positioned on a first chip 11 of the array 10. Additional silicon chips 11 each hold additional blocks of the array 10 to provide a total number of blocks sufficient to furnish the desired size of memory array. A read and write control circuit 14 is also illustrated which controls various operations of the memory array 10. The control circuit 14 includes among other components a microprocessor and read only memory for storing processes which may be implemented by the microprocessor in carrying out the functions of this invention. Also associated with the control circuit 14 are a command state machine and a write state machine. The command state machine provides a command interface between the controller 14 and the flash EEPROM memory array. The command state machine receives and controls all instructions and data sent by the host computer to the flash memory array and all data and signals provided by the flash memory array for the host. The command state machine sequences the various information from the host using the write state machine to accomplish all write and erase operations so that the writing to and reading from the array occurs in proper order. In one embodiment, each of the chips 11 has its own command state machine and write state machine.

The microprocessor of the control circuit 14 may issue commands to the command state machine to cause it to carry out various function such as write and erase. Details of the command state machine and the write state machine are disclosed in U.S. patent application Ser. No. 07/655,643, entitled *Command State Machine,* Fandrich et al, filed Feb. 11, 1991, and assigned to the assignee of the present invention, and in U.S. patent application Ser. No. 07/654,375, entitled *Circuitry and Method For Programming and Erasing A Non-volatile Semiconductor Memory,* Kynett et al, filed Feb. 11, 1991, and assigned to the assignee of the present invention.

Once any one of the blocks has been erased, data may be written to any position on the entire block. When a host begins writing data to be stored in the array to some block of the array, the data is written sequentially, sector by sector, to the free space in the first block selected until that block has been filled with data. Then writing proceeds to the next sequential block. At any point after writing is completed, the information may be read back from the array 10 by interrogating the block and sector at which the data is stored.

When updated information is to be written to a sector which already contains information, in contrast to the prior art, the new information is written to a new or newly-erased location containing free space on some one of the blocks of the array 10. This, rather than writing over the old information, occurs because the old information can only be rewritten if the entire block on which it is stored is first erased. To erase an entire block without destroying valid data would entail copying all of the valid data to another block of the array 10, erasing the original block, rewriting the valid data back to the original block, then rewriting the updated data over the old entry on the original block. Instead the updated information is written to a new position on a different unfilled block (e.g., block B7), and the old position is marked invalid (dirty). A block is usually not erased until a large number of dirty sectors exist and the number of valid sectors to be saved is substantially reduced.

Because of this arrangement by which data is rewritten in the array to a different physical position, the sector number which is used to indicate where data is stored is really a logical sector number. In order to allow the use of logical sector numbers, the microprocessor of the control circuit 14 creates a lookup table 17 in random access memory 16 listing logical sector numbers against physical positions within the array 10 so that data in the array 10 at any particular logical sector may be accessed.

Also, because of this arrangement by which data is replaced, each block of the array will after some time have a number of entries which are marked invalid and cannot be used for storage. Consequently, as the array 10 fills with data, a point will come when it is necessary to clear out invalid information from a block in order to provide space for new information to be stored. Typically, the dirtiest block of the array 10 is chosen for erasure. This allows the smallest amount of valid data to be moved to another block of the array from the block to be erased. Once the valid information is written to another block and the new physical addresses are recorded in the lookup table 17, the block from which the information was read is erased. It is then placed back in operation as an entirely clean block. In one embodiment, the cleanup operation is a process run by the microprocessor of the control circuit 14. The details of the cleanup process are disclosed in U.S. patent application Ser. No. 969,760, entitled *A Method Of Cleaning Up Solid State Memory Disk Storing Floating Sector Data*, S. Wells, filed on even date herewith, and assigned to the assignee of the present invention.

Figure 2:
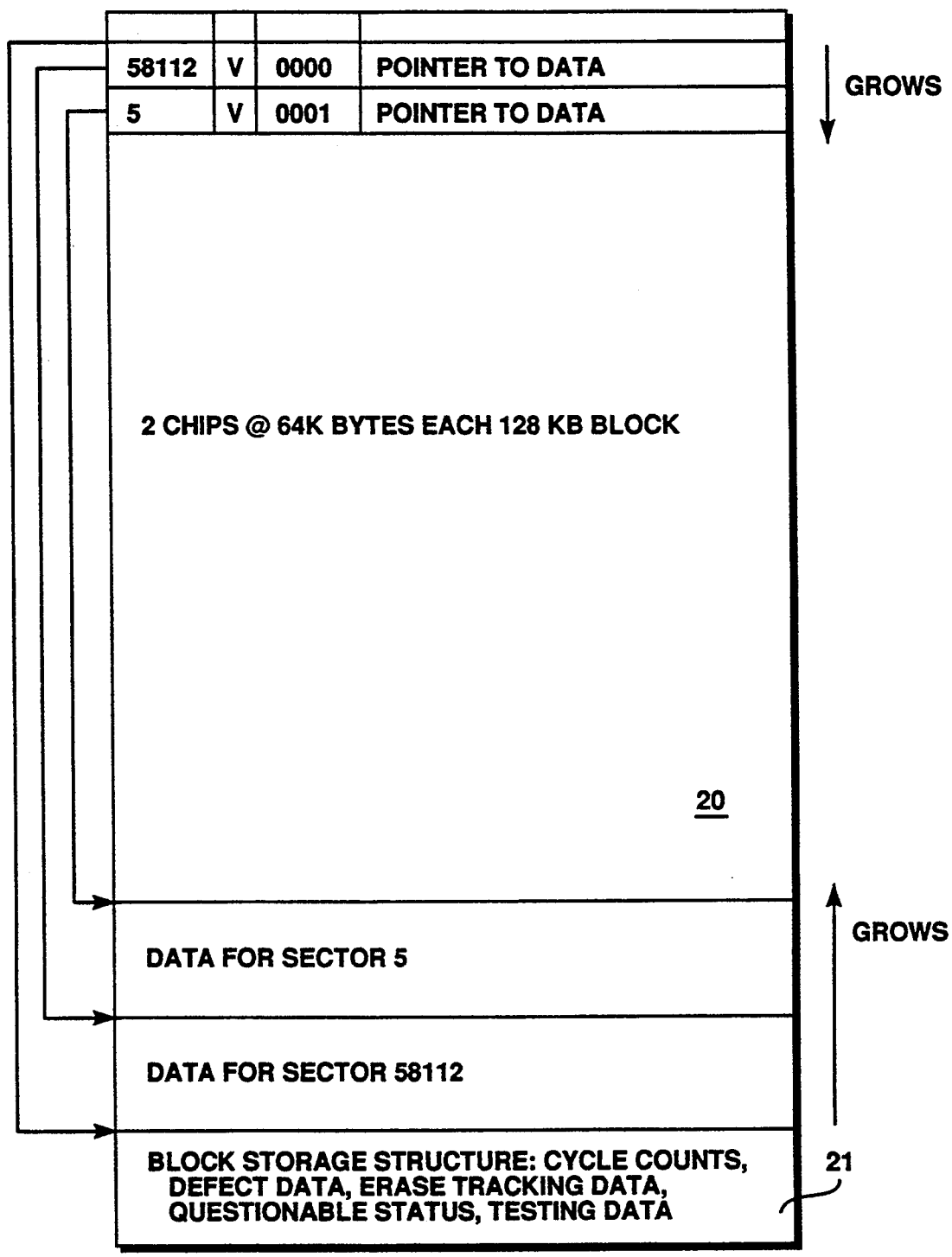
FIG. 2 is a diagram illustrating an individual block of the flash EEPROM memory array of FIG. 1.

FIG. 2 is an idealized drawing which illustrates one arrangement of an individual block of the array 10 and is useful in describing the way data is stored. A typical block 20 is illustrated as a rectangular area. The area includes a plurality of transistor devices typically arranged in rows and columns to provide the desired storage. The individual transistors and the various column and row select lines and other conductors for operating the block are not illustrated but are well known to those skilled in the art of designing flash memory.

As may be seen in FIG. 2, data is stored in the block 20 beginning at the top of the block and near to the bottom. At the top of the block 20 in identification fields or headers are stored the logical sector numbers used by the operating system as addresses for the data. For example, a first sector number 58112 is stored as the part of the first header at the top. In each header with the sector number are stored among other things an indication of the validity of the entry, a revision number, and a pointer value. The indication of the validity of the entry stores at least one bit which indicates valid when a one value and invalid when a zero value. In one embodiment, two bits are used, and both must be ones to indicate a valid entry. The revision number is used in carrying out the present invention and is, in one embodiment, a four bit number. The pointer value points to a physical address on the block 20 which is an offset from the beginning of the block at which the data for logical sector 58112 is stored. An arrow in FIG. 2 illustrates this physical position at which the first byte of data for the logical sector are stored. In the case of logical sector 58112 which is the first sector on the block 20, the data is written from the address at the address stored with the sector number 58112 to a point at the beginning of the data area which is marked by a beginning pointer value illustrated by an arrow extending from the upper left hand corner of the block 20. FIG. 2 also shows a second logical sector 5, its revision number, its valid indication, and its pointer directed to a physical position on the block 20 which stores the first byte of the data for sector 5.

As was pointed out above, the physical position of the sector number is stored in a lookup table 17 (which is preferably held in random access memory 16 on the silicon chip which holds the other components of the array 10) with the chip number, the block, and the sector offset for retrieving the data. The data stored in any sector of the block 20 may be retrieved by retrieving the physical position of the logical sector number from the table 17, going to the position on the block 20 where the sector number is stored, and retrieving the pointer to the beginning position of the data and the pointer to the beginning position of the sector whose number is stored immediately above the sector number being retrieved. These two values determine the starting and ending positions for the sector the data of which is sought.

As mentioned above, the command state machine is devised to control, the programming, reading, and erasing of the flash EEPROM memory array. Because it controls all information passed between the host and the memory array, the command state machine and the control circuit 14 are able to control the operations so that the external host which is writing to and receiving information from the flash array is typically not aware that an erasure is taking place even though the erasure requires one or two seconds. One of the ways in which this is accomplished is through an erase suspend command provided by the command state machine. This command gives the command state machine the ability to suspend the long erasure process in order to allow various commands from the host to be implemented.

The primary command which is allowed during the erase suspend mode of operation is the read command. This allows the host to obtain information necessary to its operations without knowing that a portion of the array is in the process of being erased. Write operations to the block of the array being erased and to the chip on which it sits are not allowed, however, because the command state machine is occupied with the erase process.

It is, however, possible to write changed data originally stored on the chip containing the block being erased to blocks on other chips. The write state machine simply finds unused space on another chip in the array and writes to that space. This is possible because the addressing scheme used treats the address as a logical address and records that logical address along with the physical address in the table 17 in random access memory 16 maintained by the microprocessor of the controller 14. The writing of changed data to a new physical address requires, however, that the lookup table entry (in table 17 of FIG. 1) be updated with the new physical position in the array and that the old entry (with the logical sector number at the top of the block of FIG. 2) on the block being erased be marked as invalid. The old entry must be so marked because unless it is marked as invalid the lookup table 17 stored in random access memory cannot be reconstructed after power is removed and reapplied.

Normally, this causes no problem. The table 17 (which stores each logical sector number along with the physical address so that the data may be recovered) is stored in random access memory and may be changed. Whenever data in a sector is changed and written to a new physical position, the physical position of the data is changed in the lookup table 17. However, if the data being changed was stored in a block on a chip which has a block which is presently being erased, then the invalid marking cannot be applied to the old entry since this requires a write operation to a chip which is being erased. Consequently, the marking cannot be accomplished until the erase process has been completed.

Since the lookup table 17 is stored in random access memory, it is lost when power is removed from the system. Normally, the table 17 is reconstructed when power is reapplied. The microprocessor of the control circuit 14 looks at each of the logical sector entries in each block to see which sectors are valid. These valid sector entries are listed in the table 17 along with the physical offset, block, and chip at which they are placed. However, if a sector cannot be marked invalid because it is on a chip on which a block is being erased when power is removed from the array, then when the table 17 is reconstructed, at least two apparently valid logical sectors will exist in different blocks of the array. The present invention resolves this problem.

The normal manner in which the writing of changed data takes place is as follows. The data is provided by the host with the logical sector to which it is to be written. The controller 14 goes to the table 17 to determine the old physical address. The controller 14 then seeks the header information at the old physical address to invalidate the data at that address by writing to the invalid bit(s) in the header. The controller 14 then allocates free space for writing the changed data and writes a new header for the sector into the new entry position with a pointer to where the data is to be stored. At the new entry, the entry is typically indicated to be valid and the revision number is maintained form the old header. The data is then written to the physical data space indicated by the pointer. The controller 14 then updates the lookup table entry with the new physical position.

This all works so long as a block on the chip with the old data is not being erased. When the controller 14 attempts to write to the old physical address to invalidate the entry on a chip 11 being erased, it receives a busy signal indicating that a block is being erased on the chip. Until the present invention, there was nothing the controller 14 could do other than simply mark the table 17 with the new physical address so that the controller 14 would find the current data at that position.

It should be noted that the busy signal is not returned during a preliminary portion of the cleanup process until the block is actually being erased. Part of the cleanup process requires that the controller 14 select free space for the valid data on the block and move that data to the free space. The controller 14 does this by marking the new entry with the pointer into the new sector and then transferring the data from the old entry. The controller then reads the header information from the old entry. This header information including the logical sector number and the valid indication is placed in the new entry with the pointer after the data has been written. If the data in the old sector has been invalidated during the period in which the data was being moved, then the header information includes the invalidation applied to the new entry.

However, the problem still exists of not being able to invalidate the old entry during the actual erase operation because of not being able to write to the block. Using the present invention, instead of simply writing to the new chip 11 and updating the table 17 with the new physical position, the microprocessor of the controller 14 also writes to another table which may be in random access memory 16, a sector busy table 18 (see FIG. 1). This sector busy table 18 records write operations during a period in which a chip is busy. The table 18 lists those entries (by the chip, block, and the offset of the header of the sector of the chip) which are busy. When the erase finishes, the controller 14 takes the data from the sector busy table 18 and invalidates each of the entries listed.

This allows the controller 14 to overcome its inability to write to a sector on a chip which is being erased when the data at that logical sector is updated. However, it does not solve the problem caused by the loss of power during the erase process since the RAM sector busy table 18 will be lost when power is lost; and the same problem will exist as that which exists with respect to reconstructing the table 17 when power is lost.

To provide a solution to this difficulty, the present invention also increments a revision number stored in the header for each entry when it attempts to mark an old entry invalid and receives a signal indicating the chip for which a sector is to be invalidated is busy being erased. In one embodiment, this revision number is a four bit value which is stored with the header for the new changed entry. When the controller 14 receives the busy signal in attempting to write to invalidate the old entry, it reads the old entry header to determine the old revision number. The old revision number is incremented by one and replaces the revision number at the new entry at the logical sector number position of the new physical position when the header information is written. FIG. 2 illustrates logical sector 5 with a revision number 0001. This incrementing of the revision number only occurs when an attempt is made to mark a sector dirty in a busy chip.

Once the erase is completed, the microprocessor of the controller 14 reviews the RAM sector busy table 18 and writes to the appropriate positions to invalidate all of the entries listed in the table. It should be noted that one embodiment of the invention uses a table 18 having room for one thousand entries.

Thus, if power fails before the block entry can be invalidated, when power is applied, the controller 14 attempts to reconstruct the table 17 and finds two copies of the same logical sector number. The controller 14 compares the revision number stored with the logical sector number of each entry and picks the largest to determine which is the latest and therefore contains the valid data. The controller 14, is thus, able to invalidate any sectors which contain invalid data and reconstruct the table 17.

Since the revision number includes four bits, it is possible for the revision number of an entry to be incremented beyond the binary number 1111. For this reason, the microprocessor of the controller 14 includes a process for determining that a value of 0000 or 0001 is greater than the value 1110 or 1111. Typically, this is easily accomplished by a software comparison which checks for the values 1110 and 1111 for valid entries, and if it finds those revision numbers along with entries of 0000 for entries when reconstructing the table 17, ignores the higher numbered entries and selects the highest of the lower numbered values for the same valid logical sectors.

Figure 3:
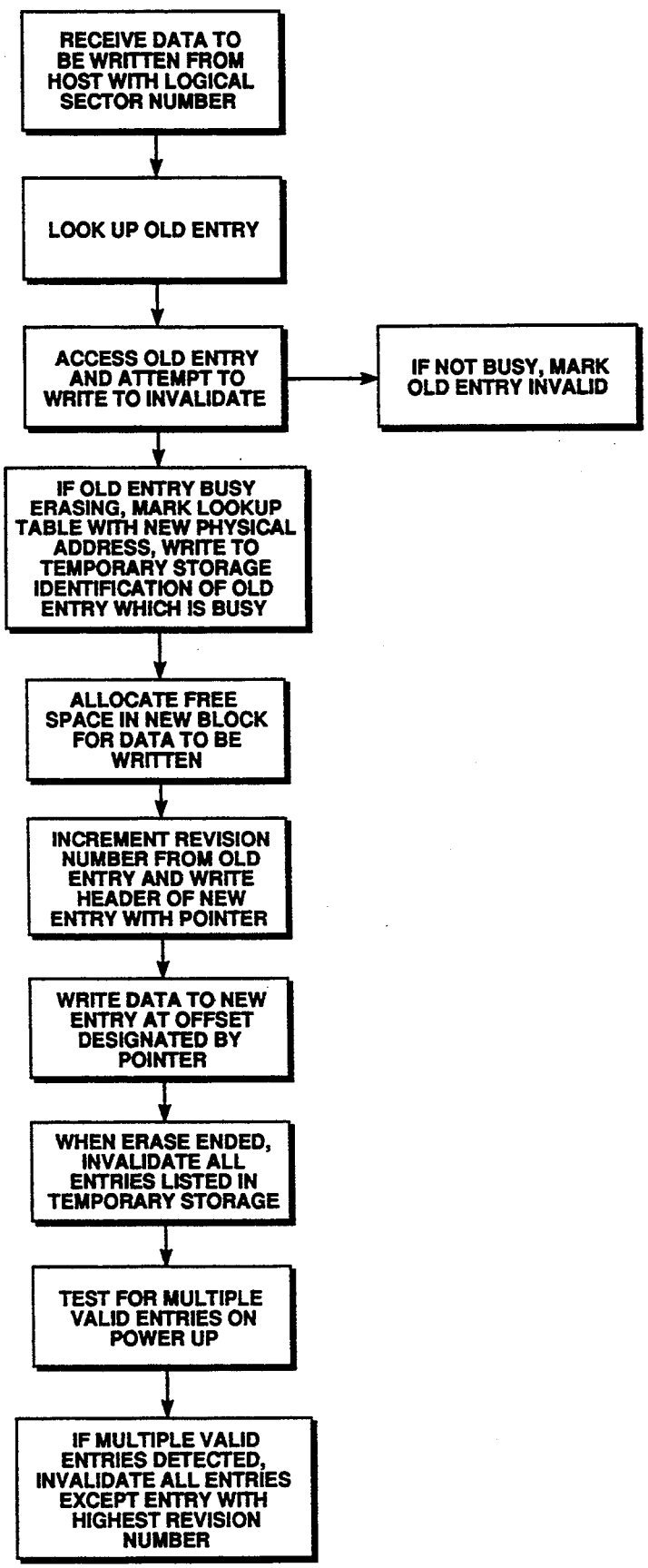
FIG. 3 is a flow chart illustrating a method in accordance with the present invention.

The steps of the process of this invention which have been described in detail above are shown in order in the flow chart of FIG. 3 as practiced during an operation in which an attempt is made to write to a sector on a chip being erased, the write to invalidate cannot be accomplished so the failure to write is stored in the sector busy table to be applied to the old entry when a write is possible, the revision number of the old entry is incremented for the new sector, and the presence of duplicate sectors is determined and resolved on power up.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method for writing data to an entry in a portion of a flash EEPROM memory array during a period in which the portion of the array is being erased and writing is prohibited, the method comprising the steps of:
    writing the data to a new entry position apart from the portion of the array which is being erased along with a revision number for the new entry which is greater than a revision number of the entry holding in the original data in the portion of the array being erased,
    writing an indication of the busy condition of the original entry to a temporary storage position apart from the portion of the array which is being erased,
    invalidating entries listed in the temporary storage position when the erase operation is concluded, and
    testing for duplicate entries when power is applied to the array to determine which entry is valid.

2. A method for writing data to an entry in a portion of a flash EEPROM memory array during a period in which the portion of the array is being erased and writing is prohibited as claimed in claim 1 in which the step of writing the data to a new entry position apart from the portion of the array which is being erased along with a revision number for the new entry which is greater than a revision number of the entry holding in the original data in the portion of the array being erased comprises a step of incrementing the value of a revision number of the entry holding in the original data in the portion of the array being erased to obtain the value of a revision number for the new entry position.

3. A method for writing data to an entry having a header and data in a portion of a flash EEPROM memory array during a period in which the portion of the array is being erased and writing is prohibited, the method comprising the steps of:
    receiving data to be written along with a logical sector number,
    looking up an old entry having the logical sector number,
    reading a header of the old entry for header data,
    attempting to write to invalidate the old entry,
    incrementing a revision number stored in header of old entry if old entry is busy,
    allocating free space in a different portion of the array for an entry including data to be written,
    writing a header including a pointer to data for a new entry for data,
    writing incremented revision number from old entry to the header of the new entry,
    writing data to the new portion of the array at the position defined by the pointer,
    marking a lookup table with the new physical address,
    writing to a sector busy table sector number of old entry which is unavailable if the old entry is busy,
    invalidating all entries listed in sector busy table when busy condition ends,
    testing for multiple valid entries on power up,
    if multiple valid entries are detected, selecting the highest revision number as valid, and
    invalidating all entries having lesser revision numbers.

4. A method for writing data to a storage position during a period in which writing is prohibited to that storage position, the method comprising the steps of:
    writing the data to a new storage position apart from the storage position to which writing is prohibited,
    writing an indication of the condition of the storage position to which writing is prohibited to a temporary storage position apart from the storage position to which writing is prohibited, and
    invalidating data in any storage position listed in the temporary storage position when prohibition against writing is ended.

5. A method for writing data to a storage position during a period in which writing is prohibited to that storage position as claimed in claim 4 further comprising the steps of:
    writing an indication at the new storage position that data at the new storage position is newer than data at the storage position to which writing is prohibited, and
    testing for duplicate entries at all storage positions after prohibition against writing is ended, and
    invalidating older ones of duplicate entries.

6. A method for writing data to a storage position during a period in which writing is prohibited to that storage position as claimed in claim 5 in which the indication at the new storage position that data at the new storage position is newer than data at the storage position to which writing is prohibited comprises a revision number, and further comprising the step of:
writing a revision number with each entry, and
in which the step of writing an indication at the new storage position that data at the new storage position is newer than data at the storage position to which writing is prohibited comprises the step of incrementing a revision number of the storage position at which writing is prohibited to determine a revision number for the new storage position.

* * * * *